US009935522B2

(12) United States Patent
Watanabe

(10) Patent No.: US 9,935,522 B2
(45) Date of Patent: Apr. 3, 2018

(54) MOTOR DEVICE

(71) Applicant: DENSO CORPORATION, Kariya, Aichi-pref. (JP)

(72) Inventor: Kazuyuki Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/608,259

(22) Filed: May 30, 2017

(65) Prior Publication Data
US 2018/0006524 A1  Jan. 4, 2018

(30) Foreign Application Priority Data

Jul. 1, 2016  (JP) .................................. 2016-131714

(51) Int. Cl.
*H02K 5/24* (2006.01)
*H02K 33/10* (2006.01)
(Continued)

(52) U.S. Cl.
CPC .............. *H02K 5/24* (2013.01); *H02K 33/10* (2013.01); *H02K 37/04* (2013.01); *H05K 1/117* (2013.01); *H05K 1/0209* (2013.01)

(58) Field of Classification Search
CPC .......... H02K 5/24; H02K 33/10; H02K 37/04; H05K 1/117
(Continued)

(56) References Cited

U.S. PATENT DOCUMENTS 8,973,543 B2 * 3/2015 Hayashi .................. F01L 1/344
123/90.17
8,991,346 B2 * 3/2015 Kinouchi .............. F01L 1/3442
123/90.17
(Continued)

FOREIGN PATENT DOCUMENTS

JP        H3-11375 Y2      3/1991
JP       2005-344395 A    12/2005
(Continued)

OTHER PUBLICATIONS

U.S. Appl. No. 15/607,987, filed May 30, 2017, Matsuyama et al.
U.S. Appl. No. 15/608,381, filed May 30, 2017, Matsuyama et al.
U.S. Appl. No. 15/607,816, filed May 30, 2017, Ishimoto et al.

*Primary Examiner* — Kawing Chan
(74) *Attorney, Agent, or Firm* — Posz Law Group, PLC

(57) ABSTRACT

A base includes first to third projected portions. A sealing surface of the base is opposed to the housing and equipped with a sealing member. An attachment portion outside the sealing surface is screwed with the housing. A first projected portion projects from the attachment portion toward the housing. The second and third projected portions project relative to the sealing surface toward the housing. A recessed portion between the sealing surface and the first projected portion partially receives and fitted with a spigot protrusion of the housing. The second projected portion is located inside the third projected portion, and the third projected portion is located inside the recessed portion in the radial direction. The second and third projected portions extend along the circumferential direction. The first to third projected portions have projected tip end surfaces located in a same plane and in contact with the housing.

4 Claims, 9 Drawing Sheets

(51) Int. Cl.
   *H02K 37/04*  (2006.01)
   *H05K 1/11*  (2006.01)
   *H05K 1/02*  (2006.01)

(58) Field of Classification Search
   USPC .......................................................... 318/466
   See application file for complete search history.

(56) References Cited

U.S. PATENT DOCUMENTS

| | | |
|---|---|---|
| 9,103,241 B2 * | 8/2015 | Hayashi ................ F01L 1/3442 |
| 9,103,242 B2 * | 8/2015 | Sugiura ................... F01L 1/352 |
| 9,115,612 B2 * | 8/2015 | Hayashi ................ F01L 1/3442 |
| 2009/0121671 A1 | 5/2009 | Uehama et al. |
| 2014/0216202 A1 * | 8/2014 | Tadokoro ................ F16H 25/10 |
| | | 74/568 R |
| 2014/0230763 A1 * | 8/2014 | Watanabe ............... F01L 1/344 |
| | | 123/90.15 |

FOREIGN PATENT DOCUMENTS

| | | | | |
|---|---|---|---|---|
| JP | 2009121292 A | * | 6/2009 | ............. F01L 1/352 |
| JP | 2015-203392 A | | 11/2015 | |

* cited by examiner

MOTOR DEVICE

CROSS REFERENCE TO RELATED APPLICATION

This application is based on Japanese Patent Application No. 2016-131714 filed on Jul. 1, 2016, the disclosure of which is incorporated herein by reference.

TECHNICAL FIELD

The present disclosure relates to a motor device.

BACKGROUND

Patent Literature 1 discloses a motor device including a case, a motor, and a control circuit portion. The case includes a cover and a metallic base. The motor is located on one side of the base. The control circuit portion is accommodated in the case and is affixed to a rear side of the base. The rear side is on the opposite side of the one side of the base.

The motor includes a housing, a stator, and a rotor. The housing is in a bottomed tubular shape and is located on a side of a one side of the base to form an accommodation space with the base. The stator is located in the accommodation space and is affixed to the housing. The rotor is rotational inside the stator.

This kind of the motor device is applied to, for example, a valve timing control apparatus configured to control a valve timing of an internal combustion engine by using rotation of the motor.

(Patent Literature 1)

Publication of Japanese unexamined patent application No. 2009-121292

In the above-descried motor device, the motor and the control circuit portion are integrated with each other. Therefore, vibration of the motor may be transmitted to the control circuit portion. In a configuration where the control circuit portion is configured as a circuit board including a printed circuit board mounted with electronic components, reliability of connection in, for example, an electronic component may raise an issue due to vibration.

Furthermore, the above-described motor device employs a waterproofing configuration using a sealing member to water-tightly seal the accommodation space of the motor and the control circuit portion. The sealing member is interposed between, for example, the outer periphery portions of the base and the housing. The present configuration employs, for example, a spigot configuration to position between the housing and the base.

Specifically, multiple spigot protrusions are equipped to the surface of an outer periphery portion of the housing on the side of the base. The spigot protrusions are arranged along the circumferential direction centered on a rotational axis of the motor. In addition, a spigot lateral surface is formed on the outer periphery portion of the base. The multiple spigot protrusions are fitted to the spigot lateral surface. In the present configuration, a machining work may be applied to a cutting surface of the base, which is formed of a metallic material, to form the spigot lateral surface, thereby to enable to secure the accuracy of positioning.

The base has a sealing surface and a through hole. The sealing surface is opposed to the outer periphery portion of the housing and is equipped with a sealing member. The base further includes multiple attachment portions, which are screwed onto an affixation object. The multiple attachment portions are equipped on the outside of the sealing surface in the radial direction relative to the rotational axis. In this configuration, the spigot lateral surface is formed, for example, to be in series with the sealing surface on the outside in the radial direction. It would be conceivable to apply a machining work locally on multiple portions thereby to form multiple groove portions correspondingly to the multiple spigot protrusions each having a spigot lateral surface. Nevertheless, this spigot configuration may become complicated. Consequently, this spigot configuration may require an additional processing work for the machining work.

In addition, this spigot configuration may further require to equip a groove portion having the spigot lateral surface on the outside of the sealing surface in the radial direction in order to secure the spigot lateral surface. In a configuration where the groove portion, which separates the attachment portion from the sealing surface exists, the base is not in contact with the housing at the sealing surface and the groove portion. Consequently, when the base is screwed to the affixation object, the base may be possibly deformed.

SUMMARY

It is an object of the present disclosure to produce a motor device having a simple spigot configuration configured to enable to protect a base from deformation when the base is screwed and affixed while restricting transmission of vibration from a motor to a circuit board.

According to an aspect of the present disclosure, a motor device comprises a case including a base and a cover. The base is formed of a metallic material and has a one side and a rear side, which is on an opposite side of the one side in a thickness direction. The cover is located on a side of the rear side and forms a first accommodation space with the base.

The motor device further comprises a motor including a housing, a stator, and a rotor. The housing is in a bottomed tubular shape and is located on a side of the one side of the base. The housing forms a second accommodation space with the base. The stator is located in the second accommodation space and affixed to the housing. The rotor is rotational in the stator. The motor device further comprises a circuit board electrically connected with the motor and including a printed circuit board and an electronic component. The printed circuit board is located in the first accommodation space of the case. The electronic component is mounted on the printed circuit board. The motor device further comprises a sealing member interposed between the base and an outer periphery portion of the cover and interposed between the base and an outer periphery portion of the housing. The housing includes a plurality of spigot protrusions and a plurality of first attachment portions. The spigot protrusions are projected from a surface of the outer periphery portion of the housing on a side of the base and are arranged along a circumferential direction centered on a rotational axis of the motor. The first attachment portions have first through holes, respectively, for screwing. The base includes a sealing surface opposed to the outer periphery portion of the housing and equipped with the sealing member. The base further includes a plurality of second attachment portions located on an outside of the sealing surface in a radial direction relative to the rotational axis and screwed together with the first attachment portions of the housing, respectively, to an affixation object. The second attachment portions have second through holes, respectively, corresponding to the first through holes. The base further includes a first projected portion projecting from a surface of corresponding one of the second attachment portions on an opposite side of a seat surface. The base further includes a recessed portion having a spigot lateral surface being a cutting surface in an annular shape to which the spigot protrusions are fitted. The recessed portion partitions the sealing surface from the first projected portions and partially receives the spigot protrusions. The base further includes a second projected portion located at an inner circumferential periphery end of an outer periphery portion of the base, extending along the circumferential direction, and projecting relative to the sealing surface. The base further includes a third projected portion projecting relative to the sealing surface and adjacent to an inner side of the recessed portion in the radial direction. The third projected portion extends along the circumferential direction. The third projected portion is located at least on an imaginary line, which connects the rotational axis with a center of corresponding one of the second through holes in the radial direction. The first projected portion, the second projected portion, and the third projected portion have projected tip end surfaces all of which are located in a same plane and define contact surfaces in contact with the housing.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

Embodiments

As follows, multiple embodiments will be described with reference to drawings. In multiple embodiments, the same referential numeral will be denoted to an element, which functionally and/or structurally corresponds to another element.

First Embodiment

First, an overview of a valve timing control apparatus employing a motor device according to the present embodiment will be described with reference to FIGS. 1 and 2.

Figure 1:
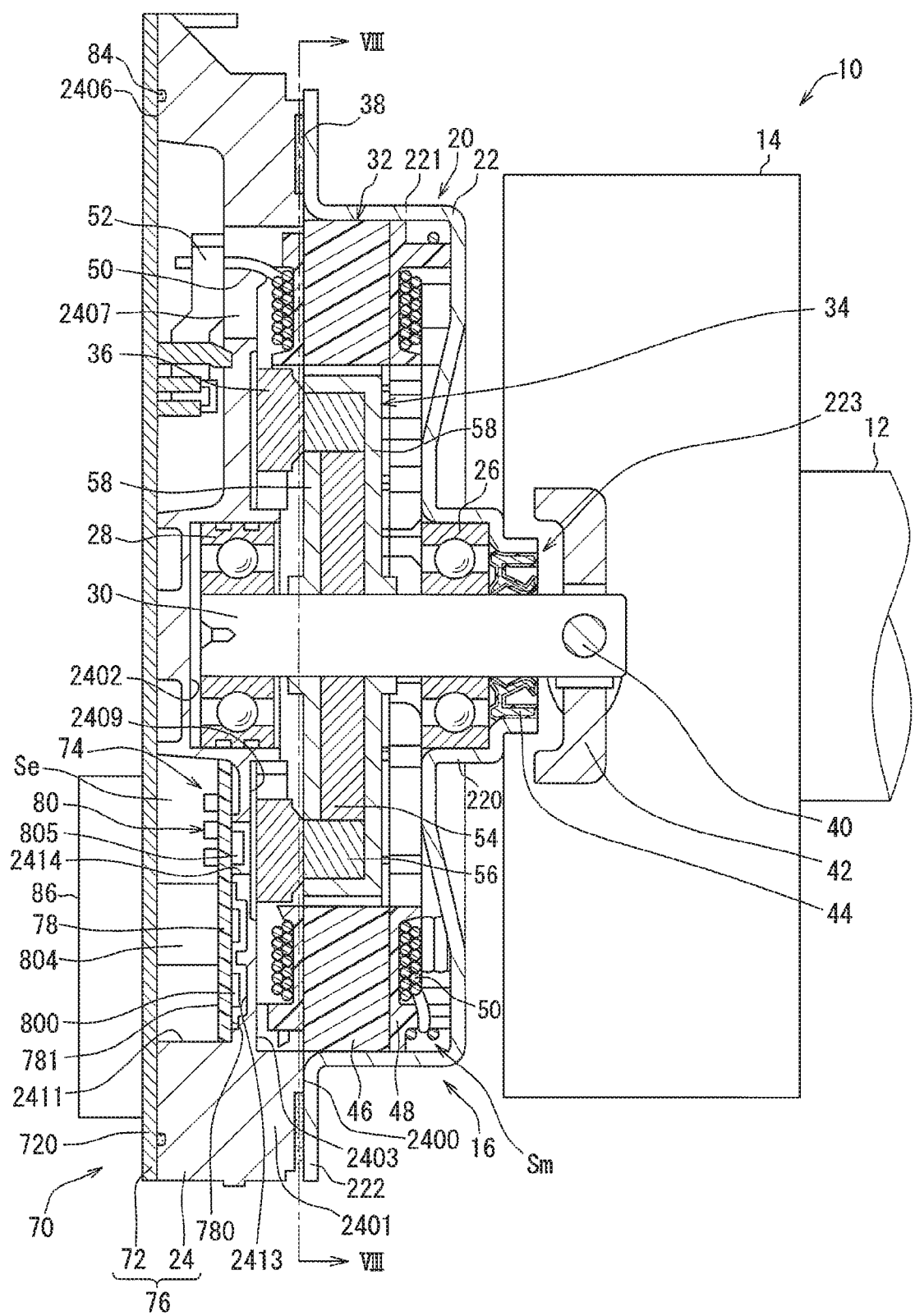
FIG. 1 is a sectional view showing a configuration of a valve timing control apparatus to which a motor device according to the first embodiment is applied.
Figure 2:
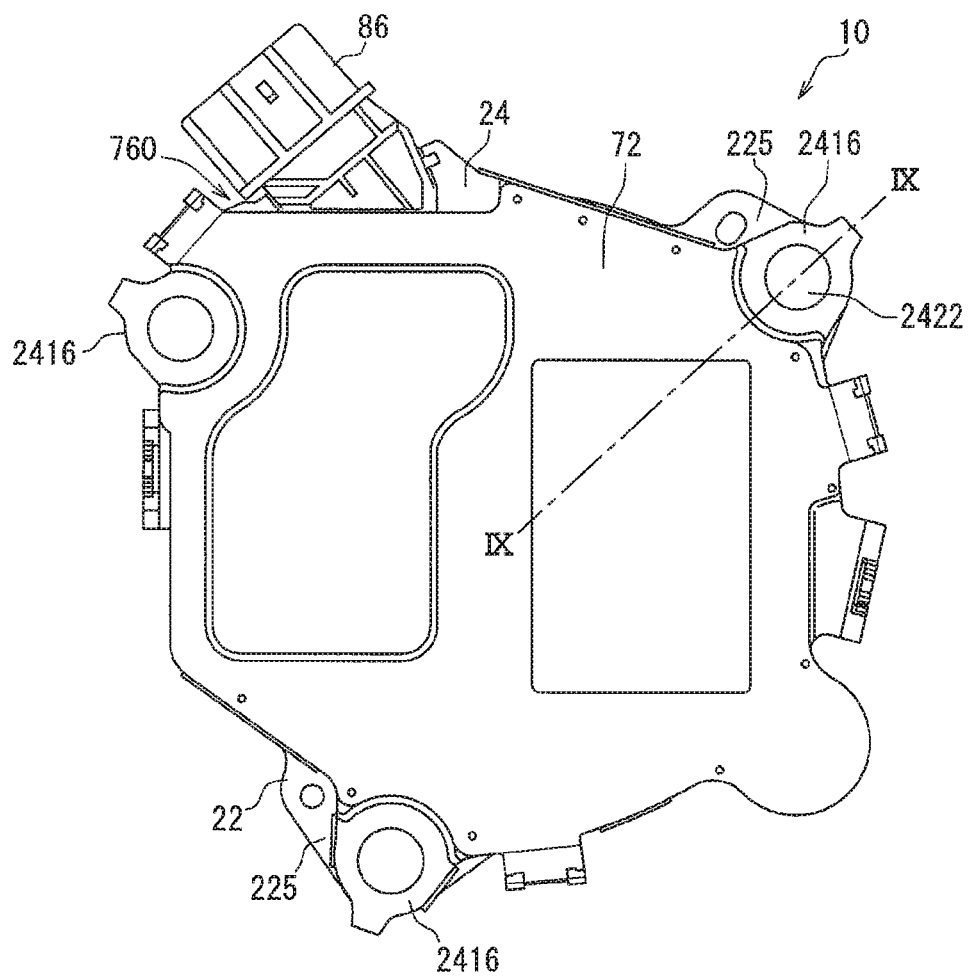
FIG. 2 is a plan view showing the valve timing control apparatus viewed from the side of the cover.

As shown in FIGS. 1 and 2, a valve timing control apparatus 10 is equipped to a transmission system, which transmits a crank torque from a crank axis (not shown) to a camshaft 12 in an internal combustion engine in a vehicle. The camshaft 12 receives transmission of the crank torque to open and close an intake valve of a movable valve (not shown) of the internal combustion engine. The valve timing control apparatus 10 controls a valve timing of the intake valve by using a motor 20, as described later.

The valve timing control apparatus 10 includes a phase control mechanism 14 and a motor device 16. The configuration of the phase control mechanism 14 may be substantially equivalent to the configuration disclosed in Japanese published unexamined application No. 2015-203392. Therefore, the configuration of the phase control mechanism 14 may be referred to the description of Japanese published unexamined application No. 2015-203392. Therefore, FIG. 1 illustrates the phase control mechanism 14 as simplified. Herein, detailed description of the phase control mechanism 14 is omitted.

Subsequently, overview of the motor device 16 will be described with reference to FIGS. 1 to 7.

As shown in FIG. 1, the motor device 16 includes a motor 20 and an actuating device 70. The motor device 16 may be referred to as a rotary electric device accommodating the actuating device 70 (electronic driver unit: EDU).

Figure 3:
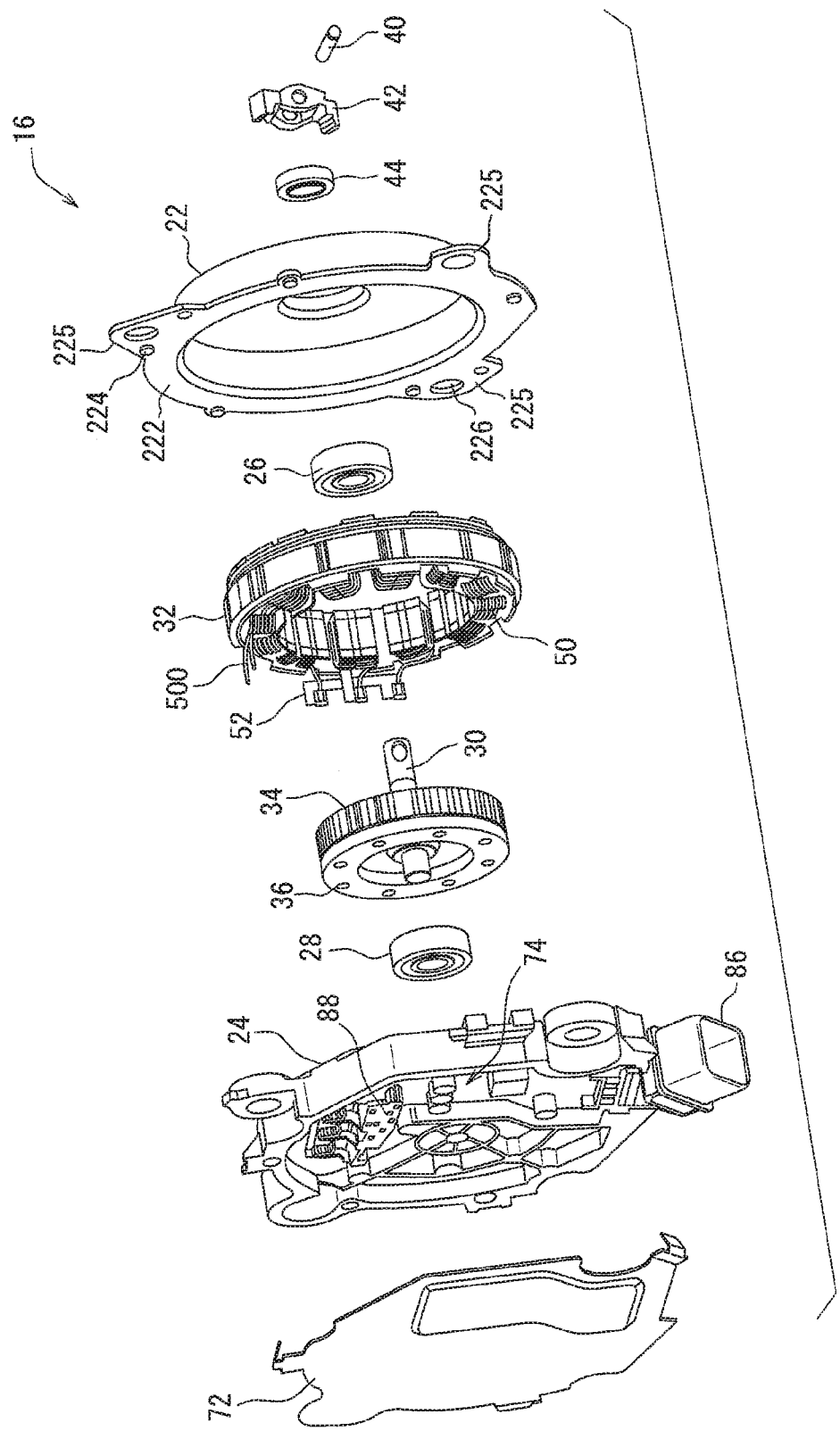
FIG. 3 is an exploded perspective view showing a schematic configuration of the motor device.

The motor 20 is a brushless permanent magnet type synchronous motor. As shown in FIGS. 1 and 3, the motor 20 includes a housing 22, a base 24, bearings 26 and 28, a motor axis 30, a stator 32, a rotor 34, and a sensor magnet 36.

The housing 22 is formed of a metallic material, such as a ferrous material, to be substantially in a bottomed tubular shape. The housing 22 is formed by applying a press-forming on a metallic plate. The base 24 is formed by using an aluminum material to be substantially in a circular plate shape. The base 24 is equipped to cover an opening of the housing 22. The base 24 is formed by die-casting an aluminum material. Other elements 26, 28, 30, 32, 34, and 36 of the motor 20 are located in an accommodation space Sm, which is formed by mounting the housing 22 to the base 24. In this way, the housing 22 and the base 24 form a case of the motor 20. In the internal combustion engine, the housing 22 and the base 24 are mounted to a stationary component, such as a chain cover. The accommodation space Sm may be equivalent to a second accommodation space.

As shown in FIG. 1, the housing 22 includes a small diameter portion 220, a large diameter portion 221, and a flange portion 222. The small diameter portion 220 is equipped on the side of a phase control mechanism 14 in an axial direction of the motor axis 30. Hereinafter, the axial direction of the motor axis 30 will be simply referred to as an axial direction. The axial direction coincides with the thickness direction of the base 24. The large diameter portion 221 is equipped on the side of the actuating device 70. The large diameter portion 221 is larger than the small diameter portion 220 in the diameter. The flange portion 222 is connected to an end of the large diameter portion 221 on the side of the actuating device 70. The flange portion 222 is extended outward in the radial direction centered on the motor axis 30. The flange portion 222 may be equivalent to an outer periphery portion of the housing 22. In addition, the center of the axis of the motor axis 30 may be equivalent to a rotational axis of the motor.

The housing 22 is located on the side of a one side 2400 of the base 24. The flange portion 222 is mounted to the one side 2400 in the outer periphery portion 2401 of the base 24. The outer periphery portion 2401 of the base 24 is outside of a portion of the base 24, which defines the accommodation space Sm, in the radial direction. A sealing member 38 is equipped between the outer periphery portion 2401 and the flange portion 222 to water tightly seal the accommodation space Se and an accommodation space Sm, which will be described later. The sealing member 38 may employ an adhesion material containing, for example, silicone as a main component.

Each of bearings 26 and 28 supports the motor axis 30 to enable the motor axis 30 to rotate in a normal direction and a reverse direction. An outer ring of the bearing 26 on the side of the phase control mechanism 14 in the axial direction is affixed to an inner surface of the small diameter portion 220 of the housing 22. An inner ring of the bearing 26 is affixed to the motor axis 30. The bearing 26 is substantially entirely located inside the small diameter portion 220 in the axial direction.

Figure 4:
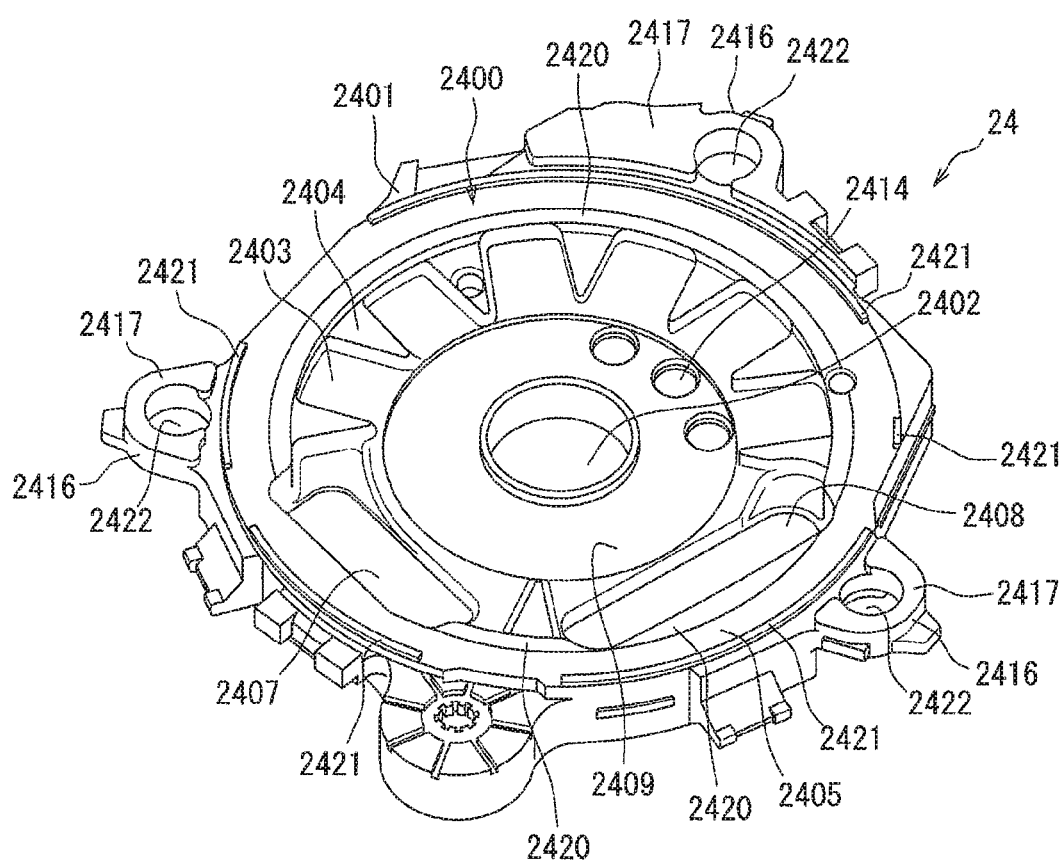
FIG. 4 is a perspective view showing a base viewed from the side of a motor.

As shown in FIGS. 1 and 4, the base 24 has a first recessed portion 2402 in the outer periphery portion 2401 on the side of the one side 2400. The first recessed portion 2402 is formed correspondingly to the bearing 28 and the motor axis 30. The first recessed portion 2402 is located close to the center of the base 24, which is substantially in a circular plate shape. The first recessed portion 2402 has the depth, which is ½ or more of the thickness of the base 24. The bearing 28 and one end of the motor axis 30 are accommodated in the first recessed portion 2402. More specifically, the outer ring of the bearing 28 is affixed to the inner circumferential periphery of the first recessed portion 2402. The inner ring of the bearing 28 is affixed to the motor axis 30. The bearing 28 supports the one end of the motor axis 30 such that the one end does not make contact with the base 24. As for the bearings 26 and 28, which support the motor axis 30, the bearing 26 is affixed to the housing 22, and the bearing 28 is affixed to the base 24.

The housing 22 has an opening 223, which is formed close to the center of the bottom portion of the housing 22. The motor axis 30 projects through the opening 223 to the outside of the housing 22. The motor axis 30 is connected with the phase control mechanism 14. A through hole is formed in an end of the motor axis 30 on the side of the phase control mechanism 14. As shown in FIGS. 1 and 3, the pin 40 is inserted through the through hole. In this way, the joint 42, which is to be connected with the phase control mechanism 14, is affixed to the motor axis 30. In addition, a sealing member 44 in an annular shape is interposed between the inner periphery of the opening 223 of the housing 22 and the motor axis 30. As the sealing member 44, for example, an oil seal is employed. The sealing member 44 is located closer to the phase control mechanism 14 than the bearing 26.

The stator 32 is supported by the housing 22. The stator 32 is press-fitted to the large diameter portion 221 of the housing 22. The stator 32 is in a tubular shape and includes multiple stator cores 46 and windings 50. The stator cores 46 include multiple teeth portions, respectively. The windings 50 are wound on the teeth portions via resin bobbin 48, respectively. Each of the stator cores 46 is formed by laminating metal pieces. The stator cores 46 are arranged along a circumferential direction, which coincides with the rotational direction of the motor axis 30, at a regular interval. The windings 50 are individually wound around the corresponding stator cores 46, respectively. That is, the windings 50 are also arranged along the circumferential direction at the regular interval. The windings 50 corresponding to the U phase, the V phase, and the W phase of the motor 20 are connected to each other through the terminal 52 for forming a neutral point. The winding 50 are supplied with a driving current via a contact 88, which will be described later. In this way, the stator 32 is caused to generate a rotational magnetic field, which acts on permanent magnets 56 of the rotor 34, which will be described later.

As shown in FIG. 4, the base 24 includes multiple second recessed portions 2403 and multiple reinforcement portions 2404. The second recessed portion 2403 is dented relative to the sealing surface 2405 of the outer periphery portion 2401 in the one side 2400. The sealing surface 2405 is a surface to which the sealing member 38 is equipped. The second recessed portions 2403 are formed correspondingly to the windings 50 of the stator 32, respectively. That is, the second recessed portions 2403 are formed at a regular interval in the circumferential direction. The second recessed portion 2403 accommodates the corresponding winding 50 not to be in contact with each other. The second recessed portions 2403 are shallower than the first recessed portion 2402 in the axial direction.

The reinforcement portion 2404 is equipped between the second recessed portions 2403, which are adjacent to the reinforcement portion 2404 in the circumferential direction. That is, the second recessed portions 2403 and the reinforcement portions 2404 are arranged alternately in the circumferential direction. The reinforcement portion 2404 partitions the second recessed portions 2403 into multiple regions. In the one side 2400, the reinforcement portion 2404 is at a position shallower than the bottom surface of the second recessed portion 2403 and is at a position slightly dented relative to the sealing surface 2405. Thus, the reinforcement portion 2404 in the present configuration enables to enhance rigidity of the base 24, compared with a configuration where the second recessed portion 2403 in a circular shape is formed.

Figure 5:
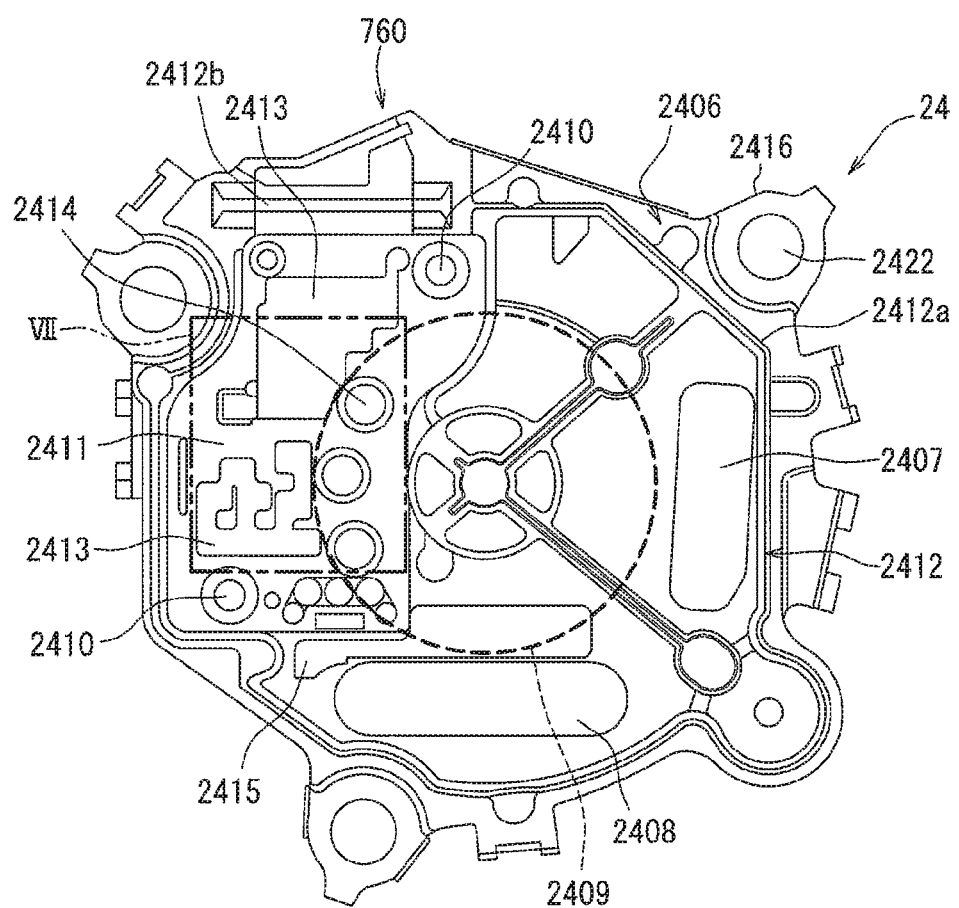
FIG. 5 is a plan view showing the base viewed from the side of a circuit board.

In addition, as shown in FIGS. 1, 4, and 5, the base 24 has through holes 2407 and 2408 extending from the one side 2400 to the rear side 2406, which is on the opposite side of the one side 2400. The through hole 2407 is formed to enable the neutral point of the motor 20 to protrude from the one side 2400 to the rear side 2406. The neutral point of the motor 20 is the joint portion among the terminal 52 and the windings 50 in the all phases. The through hole 2408 is formed to enable to electrically connect the terminal 880 of the contact 88 with the joint portion 500 of the winding 50 in each phase by, for example, welding.

The rotor 34 is rotatably accommodated inside the stator 32 which is in the tubular shape. The rotor 34 is in a disc shape projected radially outward from the motor axis 30. The rotor 34 is rotatable in the circumferential direction in both the normal direction and the reverse direction. The rotor 34 includes a rotor core 54, multiple permanent magnets 56, and stationary plates 58. The rotor core 54 is formed by laminating two or more disc-shaped core sheets. The permanent magnets 56 rotational integrally with the rotor core 54. The stationary plates 58 are equipped to ends of the rotor core 54 in the axial direction. The rotor core 54 may be affixed directly to the motor axis 30 or may be affixed to the motor axis 30 via a fitting member. The multiple permanent magnets 56 have different magnetic poles alternately in the circumferential direction.

The sensor magnet 36 is in a ring shape. The sensor magnet 36 is affixed to an outer circumferential peripheral end of the rotor 34 on the side of the base 24. The sensor magnet 36 is rotatable integrally with the rotor 34. The sensor magnet 36 is equipped to detect the rotary position of the rotor 34, i.e., the rotational angle of the motor 20. The sensor magnet 36 is alternately magnetized with an N pole and an S pole at a predetermined angular interval.

As shown in FIGS. 1 and 4, the base 24 has a third recessed portion 2409, which is dented relative to the outer periphery portion 2401 in the one side 2400. The third recessed portion 2409 is formed substantially in an annular shape correspondingly to the sensor magnet 36. The third recessed portion 2409 accommodates the sensor magnet 36. The third recessed portion 2409 is shallower than the first recessed portion 2402 and is deeper than the second recessed portion 2403 in the axial direction. The first recessed portion 2402, the third recessed portion 2409, the second recessed portion 2403, and the outer periphery portion 2401 are arranged in this order from the axial center of the motor axis 30 to the radially outside.

The actuating device 70 includes the cover 72, the circuit board 74, the connector 86, and the contact 88. The base 24 is also a component of the actuating device 70. The base 24 serves for both the motor 20 and the actuating device 70.

As shown in FIGS. 2 and 3, the cover 72 is formed of a metallic material, such as a ferrous material, to be substantially in a circular plate shape. The cover 72 is located on the side of the rear side 2406 of the base 24. The circuit board 74 is located in the accommodation space Se, which is formed by mounting the base 24 and the cover 72 to each other. The base 24 and the cover 72 form the case 76, which accommodates the circuit board 74. The accommodation space Se may be equivalent to a first accommodation space.

The circuit board 74 includes a printed circuit board 78 and multiple electronic components 80. The multiple electronic components 80 are mounted on the printed circuit board 78. The printed circuit board 78 includes a base member and a wiring. The base member contains resin as a material. The wiring is equipped to the base member. The printed circuit board 78 has a one side 780 and a rear side 781. The one side 780 is an opposed surface to the base 24. The rear side 781 is a surface on the opposite side of the one side 780 in the axial direction. The thickness direction of the printed circuit board 78 substantially coincides with the axial direction of the motor axis 30.

Figure 6:
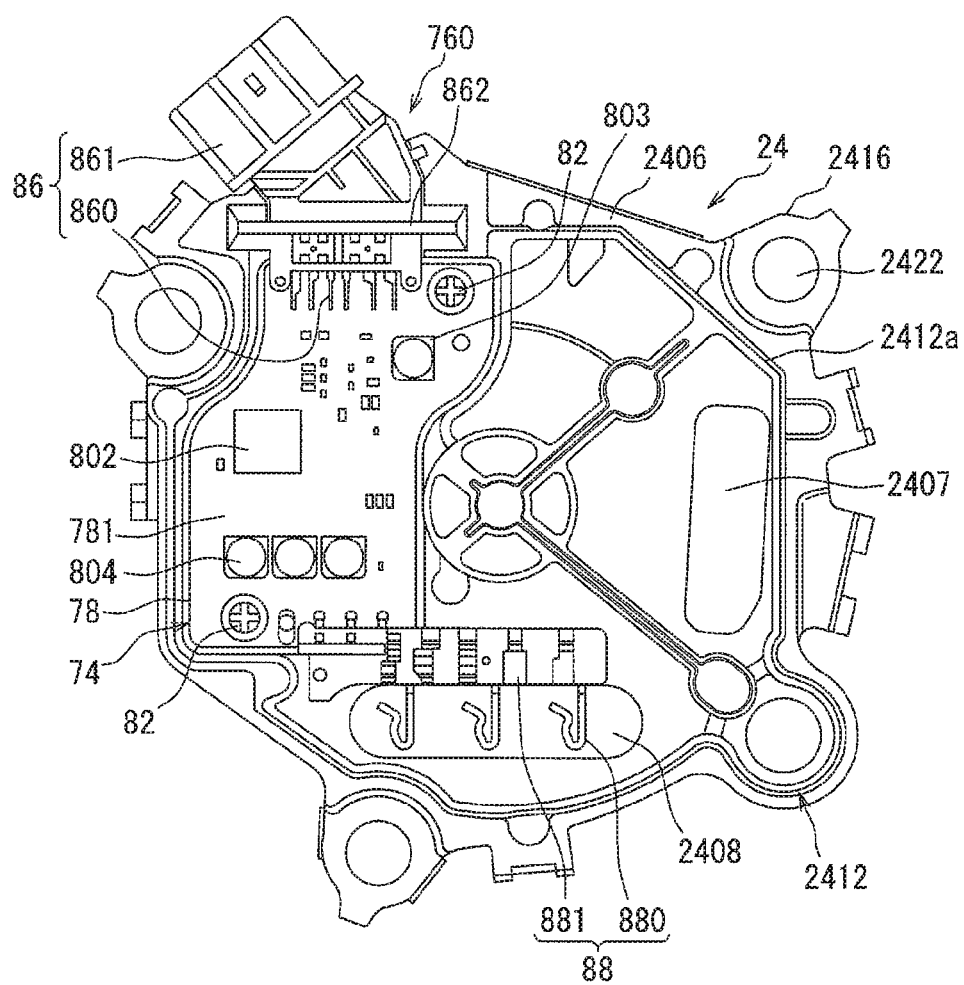
FIG. 6 is a plan view showing a state where the circuit board is affixed to the base.

As shown in FIGS. 1 and 6, the printed circuit board 78 is located on the rear side 2406 of the base 24. The printed circuit board 78 is substantially in a crank form. The printed circuit board 78 is equipped to the rear side 2406, such that the printed circuit board 78 does not overlap with the first recessed portion 2402 in a projection view along the axial direction. That is, the printed circuit board 78 is equipped to circumvent the bearing 28 and the motor axis 30. As shown in FIG. 6, the printed circuit board 78 is affixed to the base 24 by using two screws 82. The printed circuit board 78 has through holes (not shown) formed at diagonal positions corresponding to the screws 82. As shown in FIG. 5, the base 24 has screw holes 2410, which are formed correspondingly to the screws 82.

As shown in FIGS. 1 and 5, the base 24 has a fourth recessed portion 2411 on the side of the rear side 2406 in the outer periphery portion 2401. The fourth recessed portion 2411 is formed correspondingly to the circuit board 74. The circuit board 74 is mostly accommodated in the fourth recessed portion 2411. An inner groove portion 2412 is formed in the outer periphery portion 2401 to surround the circuit board 74 and a joint portion between the circuit board 74 and the motor 20. That is, the inner groove portion 2412 is formed at a position to enable to seal the accommodation space of the case 76 water-tightly.

The cover 72 is located on the side of the rear side 2406 of the base 24. A sealing member 84 is equipped between the outer periphery portion 2401 of the base 24 and the outer periphery portion 720 of the cover 72 to water-tightly seal the accommodation space Sm and the accommodation space Se. The sealing member 84 is located at the inner groove portion 2412 of the base 24. The sealing member 84 may employ an adhesion material containing, for example, silicone as a main component. The accommodation spaces Sm and Se communicate with each other through the through holes 2407 and 2408 and the through hole 2414, which will be described later. The sealing members 38 and 84 watertightly seal the accommodation spaces Sm and Se together with the sealing member 44.

The multiple electronic components 80 are mounted on both the one side 780 and the rear side 781 of the printed circuit board 78. The electronic components 80 include MOSFETs 800, a driver IC 801, a coil 802, capacitors 803 and 804 and/or the like. The electronic components 80 are elements forming a circuit to drive the motor 20 together with the wiring of the printed circuit board 78. The MOSFETs 800 form a three-phase inverter to drive the motor 20. More specifically, six MOSFETs 800, which form a three-phase inverter, are mounted on the one side 780 of the printed circuit board 78. The three-phase inverter includes upper arms and lower arms corresponding to three phases. The upper arms of three phases are connected to a high potential power source line. The lower arms of the three phases are connected to a low potential power source line.

The driver IC 801 detects the rotary position of the rotor 34 according to a detection signal of hall elements 805, which will be described later. The driver IC 801 acquires, from a microcomputer of an ECU (not shown), a signal to instruct the rotational direction and the revolution of the motor 20. The driver IC 801 generates a gate driving signal for each of the MOSFETs 800 according to the instruction signal and the rotary position. Thus, the driver IC 801 sends the gate driving signal to each of the MOSFETs 800.

Figure 7:
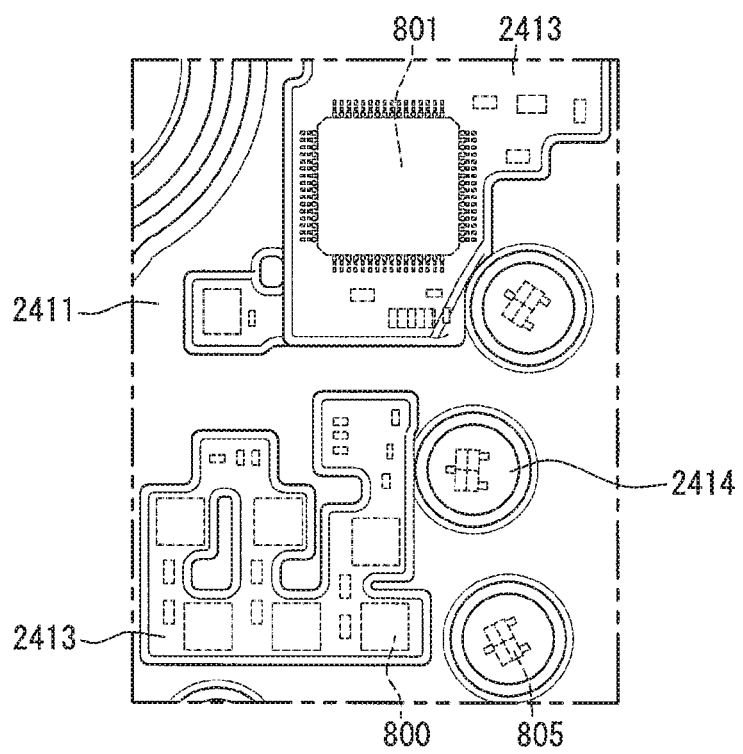
FIG. 7 is a view showing a physical relationship between the base and electronic components in a region shown by a two-point chain line VII in FIG. 5.

As shown in FIGS. 1, 5, and 7, the base 24 has a fifth recessed portion 2413 dented further relative to the bottom surface of the fourth recessed portion 2411 in the rear side 2406. The fifth recessed portions 2413 are formed correspondingly to at least a part of the electronic components 80, which are located on the one side 780 of the printed circuit board 78, excluding the hall elements 805. In FIG. 7, in order to show the physical relationship of the base 24 and the electronic components 80, the electronic components 80 are illustrated with the dashed line.

The fifth recessed portions 2413 are formed correspondingly to the MOSFETs 800 and the driver IC 801, respectively. As shown in FIG. 5, the fifth recessed portions 2413 are formed at positions, which do not overlap with the third recessed portion 2409 in a projection view along the axial direction. That is, the fifth recessed portions 2413 are formed at positions, which do not overlap with sensor magnet 36. In FIG. 5, the dashed line shows, as a reference line, the outer circumferential periphery of the third recessed portion 2409 formed in the one side 2400. In present embodiment, the MOSFETs 800 and the driver 10801 are accommodated in the fifth recessed portion 2413 in the axial direction.

The coil 802 and the capacitors 803 and 804 are mounted on the rear side 781 of the printed circuit board 78. The coil 802 and the capacitors 803 and 804 are tall components, which are taller than other elements of the electronic components 80 in the axial direction. The coil 802 and the capacitor 803 form a noise filter. The capacitor 804 is a smoothing capacitor. In the present embodiment, three capacitors 804 are mounted on the printed circuit board 78 for stabilization. The capacitor 804 is mounted on a rear surface portion of a mounting region where the multiple MOSFETs 800 are mounted in the printed circuit board 78.

The hall elements 805 are also mounted as the electronic component 80 on the printed circuit board 78. The hall elements 805 are also mounted as the electronic component 80 on the printed circuit board 78. The hall elements 805 are mounted on the one side 780 in the printed circuit board 78. The hall elements 805 are equipped correspondingly to the sensor magnets 36. In the present embodiment, the hall elements 805 include three elements equipped at a predetermined rotation angular interval along the circumferential direction.

The base 24 has through holes 2414, each of which extends from the one side 2400 to the rear side 2406 through the base 24. The base 24 has through holes 2414, each of which extends from the one side 2400 to the rear side 2406 through the base 24. Each of the hall elements 805 is individually accommodated in corresponding one of the through holes 2414. The present configuration, in which the hall elements 805 are equipped in the through holes 2414, respectively, enables to downsize the motor device 16 in the axial direction. In addition, the present configuration further enables to avoid decrease in the sensor sensitivity caused by an eddy current arising in the metallic base 24. The through holes 2414 are formed in the bottom surface of the third recessed portion 2409.

As shown in FIG. 6, the connector 86 includes multiple terminals 860 and a housing 861. The terminals 860 are formed of a conductive material, such as phosphor bronze. The housing 861 contains resin as a construction material supports the terminals 860. A part of the connector 86 is projected to the outside through an opening 760 of the case 76. The opening 760 of the case 76 is formed with the base 24 and the cover 72. FIGS. 5 and 6 illustrate only a portion of the openings 760 on the side of the base 24.

One-end side of the terminal 860 is soldered in a state where being inserted in a through hole (not shown) of the printed circuit board 78. The other-end side of the terminal 860 is connectable with an external device. The terminal 860 electrically relays the ECU with the driver IC 801. More specifically, the microcomputer of the ECU (not shown) sends an instruction signal of the motor 20 to the circuit board 74 via the connector 86. In addition, the ECU further receives a diagnostic signal, which is sent from the circuit board 74, and a signal, which represents an actual revolution speed and an actual rotational direction of the motor 20, via the connector 86. The circuit board 74 is supplied with an electric power from an electric power source via the connector 86.

The housing 861 is mainly located on the side of the rear side 781 of the printed circuit board 78. The sealing member 84 is further interposed at an opposed portion between the housing 861 and the base 24 and at an opposed portion between the housing 861 and the cover 72. Illustration of this configuration is omitted. The sealing member 84 is equipped to the inner groove portion 2412 of the base 24. As shown in FIG. 5, the inner groove portion 2412 has a cover-opposed portion 2412a and a connector-opposed portion 2412b. The cover-opposed portion 2412a is opposed to the cover 72. The connector-opposed portion 2412b is opposed to the housing 861 of the connector 86. In addition, as shown in FIG. 6, the housing 861 has a groove portion 862 in the opposed surface, which is opposed to the cover 72. The groove portion 862 is extended along an array direction of the terminals 860 in which the terminals 860 are arrayed. Similarly to the inner groove portion 2412, the sealing member 84 is further equipped to the groove portion 862.

As shown in FIG. 6, the contact 88 includes multiple terminals 880 and a housing 881. The multiple terminals 880 are formed of a conductive material, such as phosphor bronze. The housing 881 contains resin as a construction material and supports the terminals 880. The housing 881 is mainly located on the side of the rear side 781 of the printed circuit board 78. One-end side of the terminal 880 is soldered in the state where being inserted in a through hole (not shown) of the printed circuit board 78. The other-end side of the terminal 880 is welded to the joint portion 500 of the windings 50 of the motor 20. The terminal 880 electrically relays the three-phase output lines of the inverter, which is formed in the circuit board 74, with the windings 50 of the motor 20.

As shown in FIG. 5, a sixth recessed portion 2415 is formed in the rear side 2406 of the base 24 correspondingly to a part of the contact 88. An adhesion material (not shown) is equipped to the sixth recessed portion 2415, and the contact 88 is affixed to the base 24 via the adhesion material. As adhesion material, which is formed of the same material as the material of the sealing member 84, may be employed.

The actuating device 70 further includes a heat dissipation gel (not shown). The heat dissipation gel is a thermal conduction member having a flexibility. Instead of the heat dissipation gel, for example, a heat dissipation grease may be employed as the thermal conduction member. The heat dissipation gel is interposed between the circuit board 74 and the case 76 in the axial direction. The heat dissipation gel is in contact with both the circuit board 74 and the case 76. The heat dissipation gel is interposed between, for example, the MOSFETs 800 and the bottom surface of the fifth recessed portion 2413, which is formed in the base 24 correspondingly to the MOSFETs 800. The heat dissipation gel is further interposed between, for example, a circumference portion of the MOSFETs 800 in the one side 780 and the bottom surface of the fifth recessed portion 2413. The heat dissipation gel is further interposed between the driver IC 801 and the fifth recessed portion 2413, which is formed in the base 24 correspondingly to the driver IC 801. The heat dissipation gel is further interposed between a circumference portion of the driver IC 801 in the one side 780 and the fifth recessed portion 2413. The above described heat dissipation gel mainly transmits heat of the circuit board 74 to the base 24.

Subsequently, a detailed configuration of the base 24 and the housing 22 and a positioning configuration of the housing 22 relative to the base 24 will be described with reference to FIGS. 2 to 4, 8, and 9. In FIG. 9, only the housing 22, the base 24, the cover 72, and the sealing members 38 and 84 are extracted from the motor device 16 and are illustrated for convenience of explanation. In FIG. 9, a bolt 100, which is for affixing the motor device 16 to the stationary portion of the internal combustion engine, is also illustrated.

Figure 8:
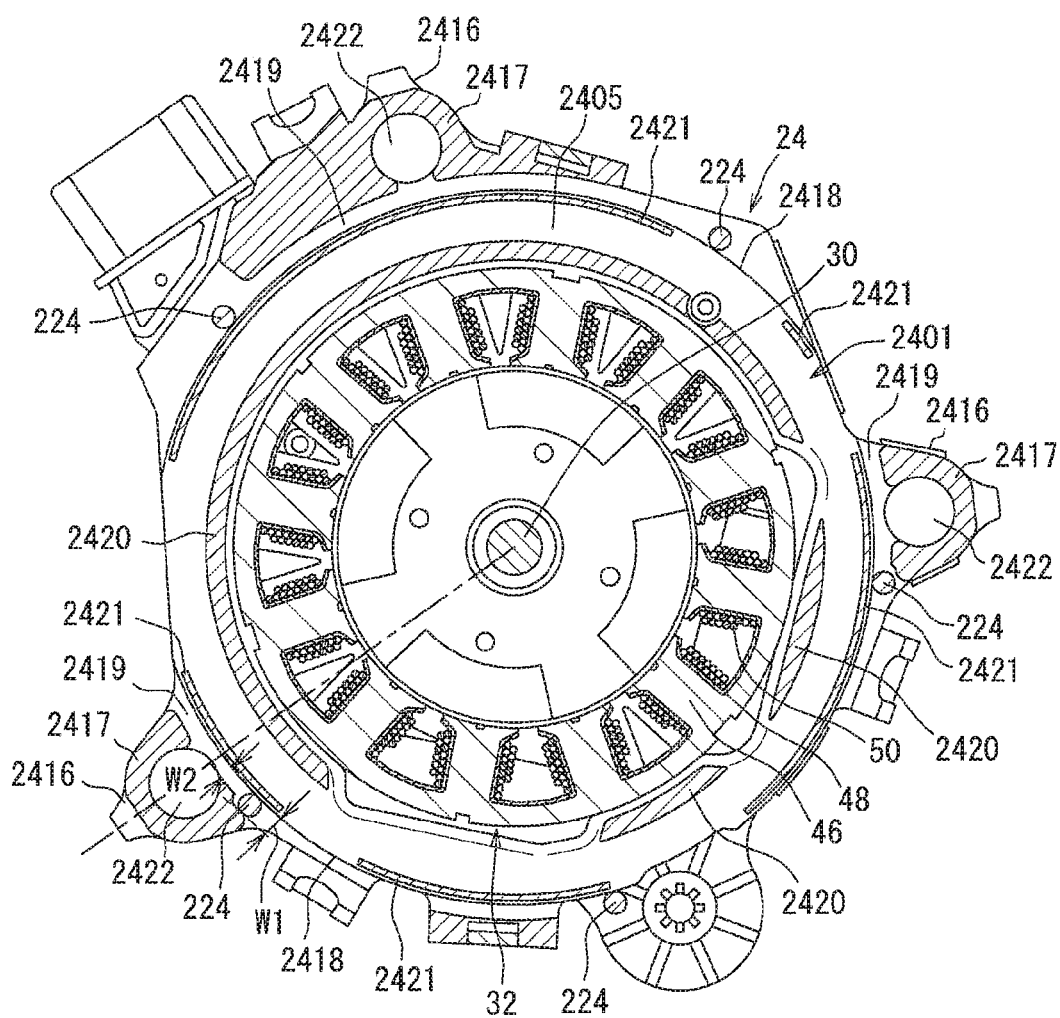
FIG. 8 is a partially sectional view taken along a line VIII-VIII in FIG. 1.
Figure 9:
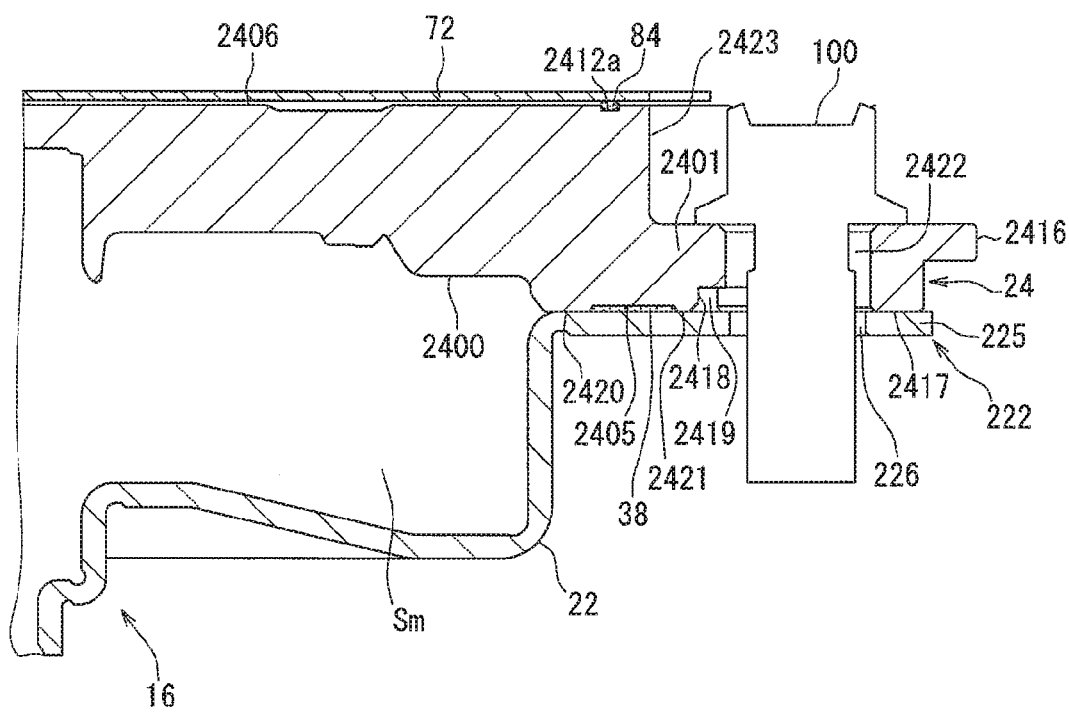
FIG. 9 is a partially sectional view taken along a line IX-IX in FIG. 2.

As shown in FIGS. 2, 3, and 8, the housing 22 includes multiple spigot protrusions 224 and multiple attachment portions 225 in the flange portion 222. The surface of the flange portion 222 on the side of the base 24 is a flat surface. The multiple spigot protrusions 224 project in the axial direction from the flat surface of the flange portion 222 on the side of the base 24. The multiple spigot protrusions 234 are arranged along with the circumferential direction centered on the motor axis 30. The housing 22 includes five elements of the spigot protrusion 224. Each of the spigot protrusions 224 is in a columnar shape.

The attachment portions 225 are equipped on the outer circumferential periphery end of the flange portion 222. The attachment portion 225 is extended radially outward from a portion of the flange portion 222 to which the sealing member 38 is equipped. The attachment portion 225 has a through hole 226, which is for screwing the valve timing control apparatus 10 to the stationary portion of the internal combustion engine. The housing 22 includes three elements of the attachment portion 225 each having the through hole 226. The multiple attachment portions 225 are arranged along the circumferential direction. The attachment portion 225 may be equivalent to a first attachment portion. The through hole 226 may be equivalent to a first through hole.

As shown in FIGS. 2, 8, and 9, the outer periphery portion 2401 of the base 24 has the sealing surface 2405, the attachment portions 2416, the first projected portions 2417, a recessed portion 2419, which defines a spigot lateral surface 2418, a second projected portion 2420, and a third projected portion 2421.

The sealing surface 2405 is a portion of the one side 2400 of the base 24 to which the sealing member 38 is equipped. The sealing surface 2405 is formed on an opposed portion of the outer periphery portion 2401 of the base 24, which is opposed to the flange portion 222. The sealing surface 2405 is extended in the circumferential direction to be in an annular form to surround the accommodation space Sm.

The attachment portions 2416 are equipped to the outer circumferential periphery end of the outer periphery portion 2401. More specifically, the attachment portions 2416 are equipped to the radially outside of the sealing surface 2405. The sealing surface 2405 is a portion of the outer periphery portion 2401 to which the sealing member 38 is equipped. The attachment portion 2416 overlaps with the attachment portion 225 of the housing 22 in a projection view along the axial direction in a state where being positioned with the spigot configuration, which will be described later. The attachment portion 2416 has the through hole 2422, which is used for screwing the valve timing control apparatus 10 to the stationary portion of the internal combustion engine. The through holes 2422 are formed correspondingly to the through holes 226 of the housing 22.

In the present embodiment, the base 24 includes three elements of the attachment portion 2416 each having the through hole 2422. The multiple attachment portions 2416 are arranged along the circumferential direction. The attachment portion 2416 may be equivalent to a second attachment portion. The through hole 2422 may be equivalent to a second through hole.

The outer periphery portion 2401 of the base 24 has the recessed portion 2423 on the side of the rear side 2406. The recessed portion 2423 is formed to include the attachment portion 2416. That is, the portion of the attachment portion 2416 on the side of the rear side 2406 defines a seat surface of the bolt 100. The recessed portion 2423 has the depth in the axial direction such that a head of the bolt 100 does not project beyond the cover 72. For this reason, the portion of the outer periphery portion 2401, which has the recessed portion 2423, is thinner than a portion of the outer periphery portion 2401, which does not have the recessed portion 2423. The recessed portion 2423 has a bottom surface and a lateral surface having a boundary portion therebetween, and the boundary portion has a predetermined R around the through hole 2422 to mitigate concentration of stress when the bolt 100 is screwed.

In each of the attachment portions 2416, the first projected portion 2417 is projected from the attachment portion 2416 on the side of the one side 2400. That is, the first projected portion 2417 is projected from the attachment portion on the opposite side of the seat surface of the bolt 100. The first projected portion 2417 is projected relative to the bottom surface of the recessed portion 2419 in the axial direction. The first projected portion 2417 equipped to be adjacent to the through hole 2422. The first projected portion 2417 is not equipped on the inside of the through hole 2422 in the radial direction. The first projected portion 2417 is integrally equipped on the outside of through hole 2422 in the radial direction and on both sides in the circumferential direction. The first projected portion 2417 is extended along the outline of the through hole 2422. A projected tip end surface of the first projected portion 2417 is a flat surface. The projected tip end surface of the first projected portion 2417 is at a position closer to the opening 223 than the sealing surface 2405 in the axial direction.

The spigot lateral surface 2418 is in an annular form coaxial with the motor axis 30. The spigot lateral surface 2418 is extended in the circumferential direction. The multiple spigot protrusions 224 are fitted to the spigot lateral surface 2418 thereby to form the spigot configuration thereby to enable positioning between the housing 22 and the base 24. Machining work is applied to the base 24, which is formed by die-casting, to cut the base 24. In this way, the spigot lateral surface 2418 is machined and formed. The machining work is employed in order to enhance accuracy of the positioning. Thus, the spigot lateral surface 2418 is formed as a cutting surface in an annular shape.

The recessed portion 2419 has the spigot lateral surface 2418 as a one wall surface defining the recessed portion 2419. The recessed portion 2419 is dented relative to the sealing surface 2405 in the axial direction. The recessed portion 2419 partitions the sealing surface 2405 from the first projected portion 2417 such that the spigot protrusion 224 is located in the recessed portion 2419 to be in contact with the spigot lateral surface 2418. The recessed portion 2419 is located on the inside of the through hole 2422 in the radial direction and is adjacent to the through hole 2422. The recessed portion 2419 has a portion, at which the first projected portion 2417 exists on the outside in the radial direction, and the portion of the recessed portion 2419 has lateral surfaces on both sides in the radial direction. One of the lateral surfaces of the recessed portion 2419, which is inside in the radial direction, is the spigot lateral surface 2418. The recessed portion 2419 has a portion which does not have the first projected portion 2417 on the outside in the radial direction, and the portion of the recessed portions 2419 does not have a lateral surface on the outside and has only the spigot lateral surface 2418 as an internal surface.

According to the present embodiment, in the portion of the recessed portion 2419 having the lateral surfaces on both sides in the radial direction, the width of the portion of the recessed portion 2419 is not constant and is partially different. Specifically, a fitted portion of the recessed portion 2419, in which the spigot protrusion 224 is in contact with the spigot lateral surface 2418, has a width W1, and a portion of the recessed portion 2419 excluding the fitted portion has a width W2. The width W1 is larger than the width W2. More specifically, in one example, the diameter of the spigot protrusion 224 is 3 mm, the width W1 is 4 mm, which is greater than the diameter of the spigot protrusion 224, and the width W2 is 2 mm, which is smaller than the diameter of the spigot protrusion 224. The base 24 is first formed by die-casting, and subsequently, the outer lateral surface of the base 24 on the side of the first projected portion 2417 is cut. In this way, the fitted portion is formed such that the recessed portion 2419 has a large width. In addition, two elements of the spigot protrusion 224 are located between the sealing surface 2405 and the first projected portion 2417 in the radial direction.

The second projected portion 2420 is equipped to the inner circumferential periphery end of the outer periphery portion 2401. The second projected portion 2420 is projected relative to the sealing surface 2405. The second projected portion 2420 is extended along the circumferential direction. The second projected portion 2420 is formed to surround the accommodation space Sm. The second projected portion 2420 formed in the annular shape may surround the accommodation space Sm. Alternatively or in addition, the second projected portion 2420 may include multiple elements formed discontinuously in separate pieces, and the multiple elements may surround the accommodation space Sm. In the present embodiment, the second projected portion 2420 is divided into multiple elements. In a portion, in which the second projected portion 2420 is equipped in the circumferential direction, the second projected portion 2420 is adjacent to the inner circumferential periphery end of the sealing surface 2405.

The second projected portion 2420 has a projected tip end surface, which is a flat surface. The projected tip end surface of the second projected portion 2420 is at a position closer to the opening 223 than the sealing surface 2405 in the axial direction. The projected tip end surface of the second projected portion 2420 is located at the same plane as a projected tip end surface of the first projected portion 2417.

The third projected portion 2421 is projected relative to the sealing surface 2405. The third projected portion 2421 is adjacent to the inside of the recessed portion 2419 in the radial direction. In other words, the third projected portion 2421 is adjacent to the inside of the spigot lateral surface 2418 in the radial direction. The third projected portion 2421 is extended in the circumferential direction to reside at least on an imaginary line, which connects the center of the motor axis 30 with the center of the through hole 2422 in the radial direction. In FIG. 8, the imaginary line is shown by the one-point chain line. In other words, the third projected portion 2421 is equipped between the sealing surface 2405 and the through hole 2422 in the radial direction.

The third projected portion 2421 is equipped to surround the accommodation space Sm. The accommodation space Sm may be surrounded by the third projected portion 2421 in an annular form. Alternatively or in addition, the accommodation space Sm may be surrounded by multiple elements of the third projected portion 2421 in a discontinuous form. In the present embodiment, the third projected portion 2421 is divided into multiple elements. In this way, each of the second projected portion 2420 and the third projected portion 2421 has the divided configuration thereby to secure a seal length in the radial direction. In addition, according to the present embodiment, the width of the second projected portion 2420 is larger than the width of the third projected portion 2421 in the radial direction. At a portion, to which the third projected portion 2421 is equipped in the circumferential direction, the third projected portion 2421 is adjacent to the outer circumferential periphery end of the sealing surface 2405.

The projected tip end surface of the third projected portion 2421 is the flat surface. The projected tip end surface of the third projected portion 2421 is at a position closer to the opening 223 than the sealing surface 2405 in the axial direction. The projected tip end surface of the third projected portion 2421 is located at the same plane as both the projected tip end surface of the first projected portion 2417 and the projected tip end surface of the second projected portion 2420. The projected tip end surface of the first projected portion 2417, the projected tip end surface of the second projected portion 2420, and the projected tip end surface of the third projected portion 2421 are in the same physical relationship in the axial direction, i.e., in a relationship of the same flush surface.

In addition, each of the projected tip end surface of the first projected portion 2417, the projected tip end surface of the second projected portion 2420, and the projected tip end surface of the third projected portion 2421 is in contact with the flat surface of the flange portion 222 on the side of the base 24. Both the housing 22 and the base 24 are formed of metallic materials, respectively. The projected tip end surface of the first projected portion 2417, the projected tip end surface of the second projected portion 2420, and the projected tip end surface of the third projected portion 2421 form metal touch surfaces with the housing 22, respectively. For example, relative to the metal touch surfaces, the depth of the sealing surface 2405 is about 0.2 to 0.5 mm, and the depth of the recessed portion 2419 is about 2 mm.

Subsequently, effects of the motor device 16 according to the present embodiment will be described.

One end of the motor axis 30 is affixed to the small diameter portion 220 of the housing 22 via the bearing 28, and the other end of the motor axis 30 is affixed to the wall surface of the first recessed portion 2402 of the base 24 via the bearing 28. The rotor 34 is integrated with the motor axis 30. The stator 32 is press-fitted to the large diameter portion 221 of the housing 22. Therefore, vibration of the motor 20 is transmitted to the circuit board 74 via the base 24 or via the housing 22 and the base 24.

In the present embodiment, the base 24 includes the first projected portion 2417 in the attachment portion 2416 of the outer periphery portion 2401. The first projected portion 2417 is equipped to the surface on the opposite side of the bottom surface of the recessed portion 2423. The first projected portion 2417 is in contact with the attachment portion 225 of the flange portion 222. The attachment portion 2416, which includes the first projected portion 2417, and the attachment portion 225 are interposed between the lower surface of the head of the bolt 100 and the stationary portion of the internal combustion engine in a state where being affixed to the stationary portion. The first projected portion 2417 is equipped at the position distant from the accommodation space Sm. Accordingly, in a configuration where the contact surface (metal touch surface) of the base 24 at which the base 24 is in contact with the housing 22 is only the projected tip end surface of the first projected portion 2417, the motor vibration cannot be regulated effectively.

It is noted that, according to the present embodiment, the base 24 includes the second projected portion 2420 at the inner circumferential periphery end of the outer periphery portion 2401. In addition, the projected tip end surface of the second projected portion 2420 is located in the same plane as the projected tip end surface of the first projected portion 2417. In this way, the projected tip end surface of the second projected portion 2420 further defines the contact surface in contact with the housing 22. In this way, the present configuration defines the contact surface in contact with the housing 22 at the position in the outer periphery portion 2401 closest to the inner space Sm, in other words, closest to the motor axis 30. Therefore, the present configuration enables to stabilize the affixation of the housing 22 to the base 24 and enables to restrict transmission of the motor vibration from the motor 20 to the circuit board 74 via the base 24.

In addition, the spigot lateral surface 2418 is the cutting surface in the annular shape. Therefore, the present configuration enables to simplify the spigot configuration compared with a configuration in which multiple groove portions, each having the spigot lateral surface, are equipped correspondingly to the multiple spigot protrusions, In this way, the present configuration enables to restrict increase in a manufacturing process for the machining work. For example, the spigot lateral surface 2418 may be formed by a lathe work.

It is noted that, in an assumable configuration where the spigot configuration is simplified by employing the spigot lateral surface 2418 in the annular shape, the recessed portion 2419 partitions the first projected portion 2417 from the sealing surface 2405. The recessed portion 2419 is adjacent to the through hole 2422. Accordingly, in a configuration where only the first projected portion and the second projected portion are the contact surfaces, which are contact with the housing, the base may deform, when being screwed and affixed, at the outer periphery portion of the through hole in the peripheral portion of the base. Specifically, stress may concentrate on the bottom surface portion of the recessed portion, and consequently, the outer periphery portion (base) may cause buckling around the recessed portion. This stress concentration has been confirmed by the inventor(s) through a stress analysis.

To the contrary, according to the present embodiment, the third projected portion 2421 is equipped at the position adjacent to the radially inner side of the recessed portion 2419. The third projected portion 2421 is equipped at least on the imaginary line which connects the center (rotational axis) of the motor axis 30 with the center of the through hole 2422 in the radial direction. That is, the recessed portion 2419 is equipped between the first projected portion 2417 and the third projected portion 2421. In this way, the contact portion between the housing 22 and the base 24 resides on both sides of the recessed portion 2419 in the radial direction. Therefore, the present configuration enables to restrict deformation of the outer periphery portion 2401 (base 24) when the base 24 is screwed.

As described above, the motor device 16 according to the present embodiment may enables to restrict the motor vibration transmitted to the circuit board 74 and to restrict deformation of the base 24, when being screwed, with the simple spigot configuration.

It is noted that, the second projected portion 2420 is projected relative to the sealing surface 2405. Therefore, the second projected portion 2420 enables to ensure the thickness of the sealing member 38. In addition, the present configuration enables to protect the sealing member 38 from being twisted off when being screwed.

Furthermore, in the present embodiment, the width of the second projected portion 2420 is larger than the width of the third projected portion 2421 in the radial direction. In this way, in the present configuration, the width of the second projected portion 2420, which is close to the accommodation space Sm accommodating the source of vibration, is wide. Therefore, the present configuration enables to further stabilize the affixation configuration between the housing 22 and the base 24 and to effectively restrict transmission of the motor vibration to the circuit board 74. Motor vibration repeatedly arises under the environment where the device in operation. The present configuration, in which the second projected portion 2420 has the large width, enables to regulate the motor vibration transmitted to the circuit board 74 over a long time period. In addition, the present configuration, in which the width of the third projected portion 2421 is narrower than the width of the second projected portion 2420, enables to restrict increase in size in the radial direction while reserving the seal length. The screwing for affixation of the base 24 is not performed repeatedly, and in consideration of this, the third projected portion 2421 is permitted to have the narrow width.

In addition, according to the present embodiment, the width of the recessed portion 2419 differs partially. Specifically, the width W1 of the fitted portion, at which the spigot protrusion 224 is in contact with the spigot lateral surface 2418, is larger than the width W2 of the portion excluding the fitted portion. Therefore, the present configuration enables to increase the area of the projected tip end surface of the first projected portion 2417 compared with a configuration which employs the recessed portion having a constant width where the spigot protrusion can reside. That is, the present configuration enables to increase the contact area with the housing 22 while enabling to simplify the spigot configuration. The present structure enables to further stabilize the affixation configuration between the housing 22 and the base 24. In addition, the present configuration enables to restrict the outer periphery portion 2401 (base 24) from causing deformation further effectively when being screwed.

The disclosure is not limited to the embodiments as exemplified above. The disclosure includes embodiments and modifications made by a person skilled in the art based on the embodiments. For example, the disclosure is not limited to combinations of the elements shown in the embodiments. The disclosure can be reduced in practice with various combinations. The technical scope of the present disclosure is not limited to the description of the embodiments. The technical scope of the disclosure should be construed to encompass various modifications.

In the above embodiments, the valve timing control apparatus 10 controls the valve timing of the intake valve. It is noted that, the valve timing control apparatus 10 may be applicable to a device, which controls a valve timing of an exhaust valve, as a movable valve, and to a device, which controls valve timings of both the intake valve and the exhaust valve, as movable valves.

In the embodiments, the hall elements 805 are shown as an example of a magnetoelectric conversion element, which detects the rotation angle of the motor 20. It is noted that, the magnetoelectric conversion element may employ, for example, a magneto-resistive effect element.

The connection with the three-phase output line and the winding 50 of the inverter in the circuit board 74 is not limited to the contact 88. The connection structure may employ another electric connection structure than the contact 88.

In the above embodiments, the motor device 16 is used for the valve timing control apparatus 10. The motor device 16 may be applied to another motor device.

The numbers of the attachment portions 225, 2416 are not limited to those in the example.

As described above, the motor device includes the case 76, the motor 20, the circuit board 74, and the sealing member 38, 84. The case 76 includes the metallic base 24 and the cover 72. The base 24 has the one side 2400 and the rear side 2406 on the opposite side of the one side in the thickness direction. The cover 72 is mounted to the rear side and forms the first accommodation space Se with the base. The motor 20 includes the housing 22, the stator 32, and the rotor 34. The housing 22 is in a bottomed tubular shape, located on the side of the one side of the base, and forms the second accommodation space Sm with the base. The stator 32 is located in second accommodation space and is affixed to the housing. The rotor 34 is rotational inside the stator. The circuit board 74 is electrically connected with the motor. The circuit board 74 includes the printed circuit board 78 and the electronic component 80. The printed circuit board 78 is located in the first accommodation space of the case and may be affixed to the rear side of the base. The electronic component 80 is mounted to the printed circuit board. The sealing member 38, 84 is interposed between the base and the outer periphery portion of the cover and is further interposed between the base and the outer periphery portion of the housing. The housing includes the multiple spigot protrusions 224 and the multiple first attachment portions 225. The spigot protrusions 224 project from the surface of the outer periphery portion on the side of the base. The spigot protrusions 224 are arranged along the circumferential direction centered on the rotational axis of the motor. The first attachment portions 225 include the first through holes 226, respectively, for screwing. The base includes the multiple second attachment portions 2416, the recessed portion 2419, the second projected portion 2420, and the third projected portion 2421. The multiple second attachment portions 2416 are located on the outside of the sealing surface in the radial direction of the rotational axis and are screwed to the affixation object together with the first attachment portion. Each of the multiple second attachment portions 2416 has the sealing surface 2405 and the second through hole 2422. The sealing surface 2405 is opposed to the outer periphery portion of the housing and is equipped with the sealing member. The second through hole 2422 corresponds to the first through hole. The recessed portion 2419 includes the first projected portion 2417 and the spigot lateral surface 2418. The first projected portion 2417 projects from the surface of the second attachment portion on the opposite side of the seat surface. The spigot lateral surface 2418 is the cutting surface in the annular shape to which the multiple spigot protrusions are fitted. The recessed portion 2419 partitions the sealing surface from the first projected portion such that the spigot protrusion is located at a part of the recessed portion 2419. The second projected portion 2420 is equipped to the inner circumferential periphery end of the outer periphery portion and arranged along the circumferential direction. The second projected portion 2420 projects to the sealing surface. The third projected portion 2421 projects toward the sealing surface and is adjacent to the inside of the recessed portion in the radial direction. The third projected portion 2421 extends in the circumferential direction to reside at least on the imaginary line, which connects the rotational axis with the center of the second through hole in the radial direction. The projected tip end surface of the first projected portion, the projected tip end surface of the second projected portion, and the projected tip end surface of the third projected portion are located in the same plane and each defines the contact surface in contact with the housing.

The present configuration includes, in addition to the first projected portion of the second attachment portion, the second projected portion at the inner circumferential periphery end of the outer periphery portion of the base. The second projected portion is further in contact with the housing. In this way, the present configuration enables the base to be in contact with the housing at the position close to the second accommodation space in the outer periphery portions of the base and the housing. Therefore, the present configuration enables to regulate motor vibration, which is transmitted to the circuit board via the base, compared with the configuration, in which the base is in contact with the housing at a position distant from the second accommodation space.

In addition, the spigot lateral surface is the cutting surface in the annular shape. Therefore, the present spigot configuration can be simplified and, consequently, increase in the manufacturing process for the machining work can be restricted, compared with a configuration, which has multiple groove portions, each of which includes a spigot lateral surface, at multiple locations correspondingly to multiple spigot protrusions.

The spigot lateral surface is in the annular shape, and thereby the recessed portion partitions the first projected portion of the second attachment portion from the sealing surface. It is noted that, the third projected portion is adjacent to the radially inner side of the recessed portion. The third projected portion is at least on the imaginary line connecting the rotation axis with the center of the second through hole. Therefore, the recessed portion is formed between the first projected portion and the third projected portion. The contact portions between the base and the housing reside on both sides of the recessed portion, and therefore, the base can be protected from deformation when being screwed.

It should be appreciated that while the processes of the embodiments of the present disclosure have been described herein as including a specific sequence of steps, further alternative embodiments including various other sequences of these steps and/or additional steps not disclosed herein are intended to be within the steps of the present disclosure.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A motor device comprising:
   a case including a base and a cover, the base formed of a metallic material and having a one side and a rear side, which is on an opposite side of the one side in a thickness direction, the cover located on a side of the rear side and forming a first accommodation space with the base;
   a motor including a housing, a stator, and a rotor, the housing in a bottomed tubular shape, located on a side of the one side of the base, and forming a second accommodation space with the base, the stator located in the second accommodation space and affixed to the housing, the rotor rotational in the stator;
   a circuit board electrically connected with the motor and including a printed circuit board and an electronic component, the printed circuit board located in the first accommodation space of the case, the electronic component mounted on the printed circuit board; and
   a sealing member interposed between the base and an outer periphery portion of the cover and interposed between the base and an outer periphery portion of the housing, wherein
   the housing includes a plurality of protrusions and a plurality of first attachment portions, the protrusions projected from a surface of the outer periphery portion of the housing on a side of the base and arranged along a circumferential direction centered on a rotational axis of the motor, the first attachment portions having first through holes, respectively, for screwing, wherein
the base includes:
a sealing surface opposed to the outer periphery portion of the housing and equipped with the sealing member;
a plurality of second attachment portions located on an outside of the sealing surface in a radial direction relative to the rotational axis and screwed together with the first attachment portions of the housing, respectively, to an affixation object, the second attachment portions having second through holes, respectively, corresponding to the first through holes;
a first projected portion projecting from a surface of corresponding one of the second attachment portions on an opposite side of a seat surface;
a recessed portion having a lateral surface being a cutting surface in an annular shape to which the protrusions are fitted, the recessed portion partitioning the sealing surface from the first projected portions and partially receiving the protrusions;
a second projected portion located at an inner circumferential periphery end of an outer periphery portion of the base, extending along the circumferential direction, and projecting relative to the sealing surface; and
a third projected portion projecting relative to the sealing surface and adjacent to an inner side of the recessed portion in the radial direction, the third projected portion extending along the circumferential direction, the third projected portion located at least on an imaginary line, which connects the rotational axis with a center of corresponding one of the second through holes in the radial direction, wherein
the first projected portion, the second projected portion, and the third projected portion have projected tip end surfaces all of which are located in a same plane and define contact surfaces in contact with the housing.

2. The motor device according to claim 1, wherein
the recessed portion has a fitted portion, at which the protrusions are in contact with the lateral surface, having a first width in the radial direction,
the recessed portion has a portion, which is other than the fitted portion, having a second width in the radial direction, and
the first width is larger than the second width.

3. The motor device according to claim 1, wherein
the second projected portion has a width larger than a width of the third projected portion in the radial direction.

4. The motor device according to claim 1, wherein the motor device is applied to a valve timing control apparatus for controlling a valve timing of an internal combustion engine with rotation of the motor.

\* \* \* \* \*